(12) United States Patent
McCarty

(10) Patent No.: US 7,452,659 B2
(45) Date of Patent: Nov. 18, 2008

(54) METHODS OF PATTERNING A SURFACE USING SINGLE AND MULTILAYER MOLECULAR FILMS

(75) Inventor: Gregory S. McCarty, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 717 days.

(21) Appl. No.: 11/066,869

(22) Filed: Feb. 25, 2005

(65) Prior Publication Data

US 2005/0202668 A1   Sep. 15, 2005

Related U.S. Application Data

(60) Provisional application No. 60/547,996, filed on Feb. 26, 2004.

(51) Int. Cl.
*G03F 7/00*     (2006.01)
*H01L 51/40*    (2006.01)

(52) U.S. Cl. .................. 430/311; 430/315; 430/313; 430/324; 430/322; 430/329

(58) Field of Classification Search .............. 430/311, 430/315, 313, 322, 324, 329
See application file for complete search history.

(56) References Cited

U.S. PATENT DOCUMENTS 5,800,967 A   9/1998  Watterston 6,824,974 B2   11/2004  Pisharody et al.
2003/0186167 A1   10/2003  Johnson, Jr. et al.

FOREIGN PATENT DOCUMENTS

| DE | 100 58 951 A 1 | 6/2002 |
| WO | WO 02/080262 A1 | 10/2002 |
| WO | WO 2004/072334 A2 | 8/2004 |
| WO | WO 2004/072334 A3 | 8/2004 |
| WO | WO 2005/008450 A2 | 1/2005 |

OTHER PUBLICATIONS

Hatzor, A., et al. "Molecular Rulers for Scaling Down Nanostructurs" Science, Fol. 291, Feb. 9, 2001, pp. 1019-1020.
Chung, Jaehyun et al. "Nanoscale gap fabrication and integration of carbon nanotubes of micromachining" 2003 Elsevier Science, vol. 104, No. 3, May 15, 2003; ISSN: 0924-4247; www.sciencedirect.com, pp. 229-235.

*Primary Examiner*—Mark F. Huff
*Assistant Examiner*—Caleen O Sullivan
(74) *Attorney, Agent, or Firm*—McKee, Voorhees & Sease, P.L.C.

(57) ABSTRACT

Surface features are fabricated using a single layer or multilayer molecular resist. The resist is preferably a selective adsorption resist. Selective adsorption resist is a resist that allows a deposited material to penetrate the resist such that the resist will reform on the top of the deposited material. Also, a nanofabricated system enables monitoring of the addition or removal of molecular species or proteins from a junction by monitoring the electronic properties of the junction.

6 Claims, 10 Drawing Sheets

METHODS OF PATTERNING A SURFACE USING SINGLE AND MULTILAYER MOLECULAR FILMS

CROSS-REFERENCE TO RELATED APPLICATIONS

This application is a conversion of and claims priority to U.S. Provisional Patent Application No. 60/547,996, filed on Feb. 26, 2004, incorporated by reference in its entirety.

BACKGROUND OF THE INVENTION

The present invention relates to the fields of nanofabrication and microfabrication in the area of surface patterning. More particularly, but not exclusively, the present invention provides for methods to pattern surfaces with extremely high resolution using molecular thin films. The present invention also provides for methods of monitoring the addition or removal of DNA, proteins, peptides, amino acids, and molecules monitoring electronic properties associated with structures made using structures made through the surface patterning methodology of the present invention.

Of primary importance in the fabrication of micron and nanometer scale structures and devices is the ability to pattern surfaces quickly and inexpensively with the required resolution and a high degree of accuracy. A variety of lithographic techniques have been developed to pattern surfaces. Commonly used conventional lithographic techniques include photolithography, photolithography utilizing a UV stepper, direct write electron beam lithography and imprint lithography. Though each of these techniques has its strengths and weaknesses, none of these techniques has demonstrated straight forward, inexpensive, efficient patterning of substrates with features or a resolution of less than 50 nanometer.

In the last ten years many techniques have been developed for the patterning of surfaces utilizing thin molecular films. These techniques include a series of methods that utilize single layer and multiple layer molecular films as resists for patterning. These molecular resist based methodologies have demonstrated inexpensive patterning of surfaces with resolutions on the order of single nanometers and up.

The ability to pattern a surface with very high resolution is very important to the fabrication of structures and devices. Without the ability to pattern surfaces with extremely high resolution the manufacture of devices at the nanometer scale would be impossible.

A related set of problems addressed by the present invention relate to the detection and quantification of biological agents such as DNA, peptides, and proteins. This detection and quantification is extremely important in medicine, biology and agriculture. Improvements in the detection of biological species will have profound affects in many areas including health care. The ability to quickly and inexpensively detect biologically important species offers the potential of improving the diagnosis and treatment of diseases. DNA plays an important role in the reproduction and maintenance of cells. Thus DNA is of great scientific interest and has been extensively studied. DNA detection, DNA hybridization detection and DNA sequencing are key fields that have huge potential impact. Currently, DNA is sequenced using gel electrophoresis, a very time consuming method. Typically in both microarray and sequencing applications DNA is detected through optical techniques by labeling the species of interest. Varying the detection scheme for DNA to an electronic based technique will provide a variety of benefits. Of course, to use an electronic based technique requires improvements in nanofabrication techniques.

SUMMARY OF THE INVENTION

There is a need for methods of patterning surfaces with extremely high resolution using molecular thin films. There is also a need for methods of monitoring the addition or removal of DNA, proteins, peptides, amino acids, and molecules monitoring electronic properties associated with structures made using such methods of patterning surfaces.

Therefore, it is a primary object, feature, or advantage of the present invention to improve over the state of the art.

It is a further object, feature, or advantage of the present invention to utilize films of a single molecule in thickness for patterning a surface.

Another object, feature, or advantage of the present invention is to utilize films of a single molecule in thickness to fabricate useful devices with dimensions from the order of a few nanometers through the millimeter size scale.

Yet another object, feature, or advantage of the present invention is to utilize films of a single molecule in thickness in the creation of structures that can be used in diverse applications in various fields, such as, but not limited to electronics, optoelectronics, biological and chemical sensing, drug discovery, and chemical synthesis.

Yet another object, feature, or advantage of the present invention is to pattern a surface using methodologies that are temporally and financially inexpensive.

A further object, feature, or advantage of the present invention is to pattern a surface using methodologies that are conducive to being used in manufacturing.

A still further object, feature, or advantage of the present invention is to pattern a surface using methodologies that can be used to form structures with accurate nanometer scale dimensions.

Another object, feature, or advantage of the present invention is to modify the current-voltage characteristics of a device through adding or removing molecules.

Yet another object, feature, or advantage of the present invention is to modify the current-voltage characteristics of a device through adding of oligonucelotides to a junction.

A further object, feature, or advantage of the present invention is to provide methods to pattern surfaces using molecular thin films.

A still further object, feature, or advantage of the present invention is to provide methods to pattern surfaces that can use either multilayer or single layer thick molecular films.

Another object, feature, or advantage of the present invention is to provide for enabling surface patterning with extremely high resolution.

Yet another object, feature, or advantage of the present invention is to detect DNA, proteins, peptides, amino acids, and molecules with structures made using molecular thin films.

One or more of these and/or other objects, features, or advantages of the present invention will become apparent from the specification and claims that follow.

According to one aspect of the present invention, molecular thin films are selectively deposited on a number of different materials. They can be increased in thickness on the surface through the use of any one of several well known coupling chemistries or by forming multilayer films. The end or tail group of the film can be tailored along with the material that is deposited onto the substrate. By properly defining the deposited material/molecular interaction a molecular film can be grown that will allow the second material to pass through the film and deposit onto the substrate or surfaces beneath the film. Utilizing this capability the resist can allow selective adsorption of the deposited material in the areas where they are deposited on the molecular film. Or the molecular layer/ deposit material interaction can be tailor to cause the deposited material to build-up on the surface of the molecular film. After deposition the film can be remain or be removed. Eliminates the need to perform a lift-off step that typically requires harsh chemicals and can reduce the yield of the process.

Thus according to one aspect of the present invention surface features are fabricated using a single molecular layer as a resist. According to another aspect of the present invention, surface features are fabricated using a single molecular layer as a selective adsorption barrier where the resist is either easily penetrated by the deposition material or the deposition material does not adsorb the resist. According to another aspect of the present invention, molecular resists are fabricated by covalently bonding addition species to form a thicker molecular resist. According to another aspect of the invention, a method to fabricate features on a surface of known size, shape and separation uses a multi-layer molecular resist as a selective adsorption resist. The selective adsorption resist will allow a material to penetrate the resist such that the resist will reform on the top of the deposited material.

According to another aspect of the present invention, a nanofabricated system enables the addition or removal of molecular species from a junction to be monitored. The junction can be monitored by monitoring the electronic properties associated with the junction. According to another aspect of the present invention, a nanofabricated system enables the addition or removal of a protein from a junction to be monitored by monitoring the electronic properties of the junction.

According to yet another aspect of the present invention a method of patterning a surface for use in a nanoscale device is provided. The method includes depositing a first material on the surface, applying a resist to the first material and to the surface, applying a molecular layer to the first material, applying a second material to the surface, such that the first material is separated from the second material by the molecular layer, wherein the second material and the molecular layer are selected such that the second material penetrates the molecular layer resist to deposit on the first material, and removing the molecular layer to result in a structure formed from the first material and the second material. The molecular layer can be a single molecular layer. The structure can be a nanogap sensor structure which may be functionalized with oligonucleotides for detection purposes.

According to another embodiment of the present invention, a method of monitoring a nanofabricated system to determine the addition or removal of oligonucleotides is disclosed. The method includes providing a nanoscale device having a pattern formed by a process of (a) depositing a first material on a surface, (b) applying a resist to the first material and to the surface, (c) applying a molecular layer to the first material; (d) applying a second material to the surface, such that the first material is separated from the second material by the molecular layer, (e) removing the molecular layer to result in a structure formed from the first material and the second material, functionalizing the nanoscale device with oligonucleotides, and detecting hybridization of the oligonucleotides.

According to another aspect of the present invention, a nanoscale device is described. The nanoscale device includes a substrate having a surface and a pattern on the substrate, the pattern having at least one nanoscale feature. The pattern is formed from the process comprising (a) depositing a first material on the surface, (b) applying a resist to the first material and to the surface, (c) applying a molecular layer to the first material, (d) applying a second material to the surface, such that the first material is separated from the second material by the molecular layer, wherein the second material and the molecular layer are selected such that the second material penetrates the molecular layer to deposit on the first material, and (e) removing the molecular layer to result in a structure formed from the first material and the second material. The nanoscale device can be a nanogap sensor wherein the at least one nanoscale feature includes a nanogap between the first material and the second material defined by a thickness of the molecular layer. The nanogap can be of any number of sizes, including sizes of less than about 10 nm, sizes of less than about 5 nm, and sizes of less than about 2 nm.

DETAILED DESCRIPTION OF THE INVENTION

The present invention is directed towards the formation of patterns on a surface. The patterns are formed using molecular lithographies or a combination of molecular and conventional lithographies. For completeness a brief review of the formation of molecular resist will be presented here. The term "molecular resist" should be defined broadly and includes a single layer molecular film or multilayer molecular films that are grown on a surface for patterning proposes. Although specific embodiments are described herein, the present invention is not to be limited to these specific embodiments.

Figure 1:
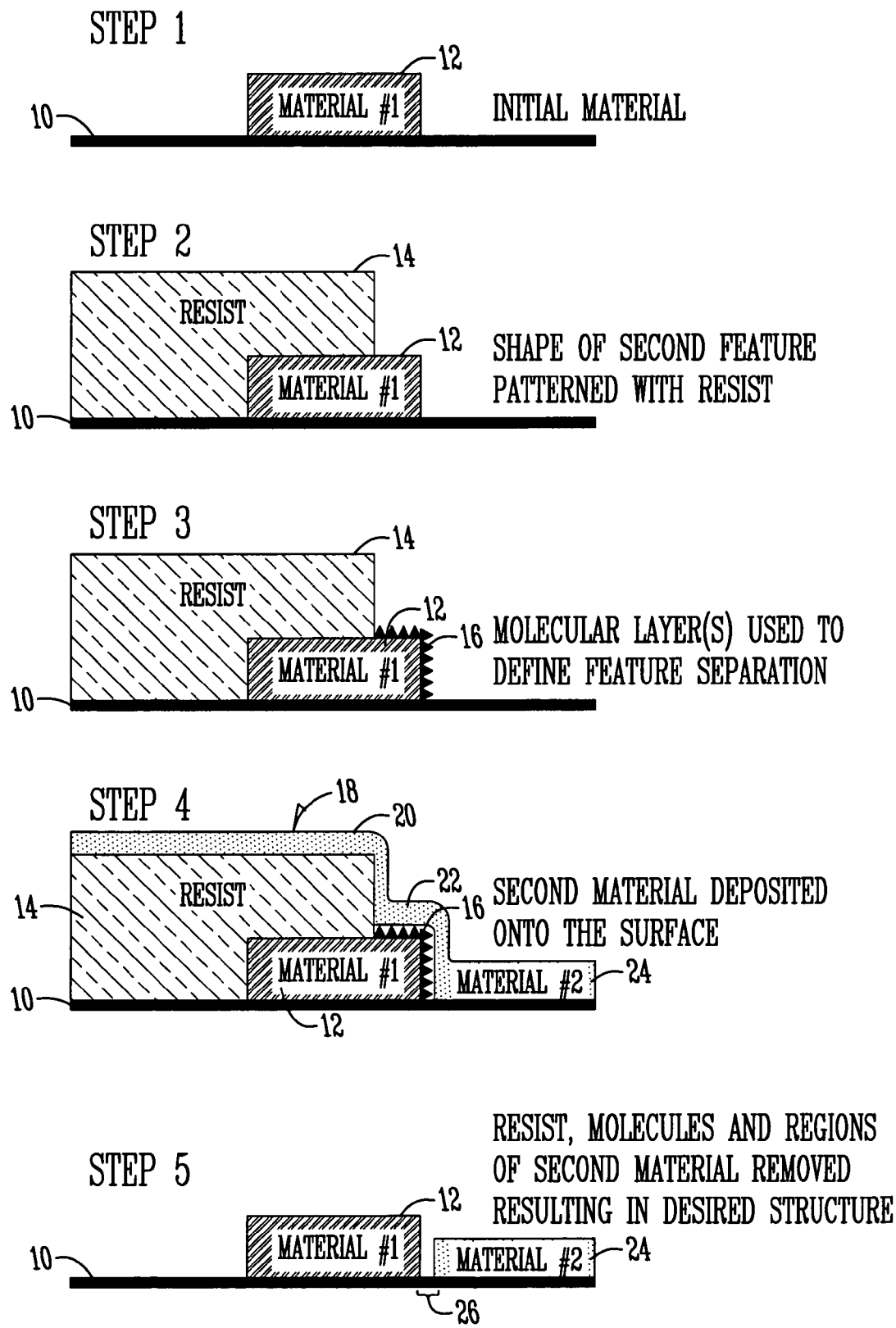
FIG. 1 is a schematic showing the major steps involved in the process to fabricate two features of defined size, shape and separation using a single layer thick molecular film as a lift-off resist.

In FIG. 1, a substrate 10 is shown. A first material 12 is formed on the surface of the substrate 10 to define a first feature. The first material 12 can be formed through any conventional or otherwise known lithographic technique. In the next step, a resist 14 is applied to a portion of the first material 12. Next, one or more molecular layers 16 are applied to the first material 12. The one or more molecular layers 16 are used to define feature separation between the first feature and a subsequently formed feature. Next, a second material 18 is deposited onto the surface. A portion 20 of the second material 18 is deposited over the resist, a second portion 22 of the second material 18 is deposited over the one or more molecular layers 16, and a third portion 24 of the second material 18 is deposited on the surface of the substrate 10. In the final step of FIG. 1, the resist 14, the one or more molecular layers 16, and the first portion 20 and the second portion 22 of the second material 18 are removed to thereby simultaneously define the shape of a feature 24 formed of the second material while defining a gap 26 between the feature formed by the first material 12 and the feature 24 formed by the second material. This process is described further in U.S. patent application Ser. No. 10/979,023, herein incorporated by reference in its entirety.

Figure 2:
FIG. 2 is a schematic showing the major steps involved in the process of fabricating two features of defined size, shape, and separation using a selective adsorption process according to one embodiment of the present invention.
Figure 2:
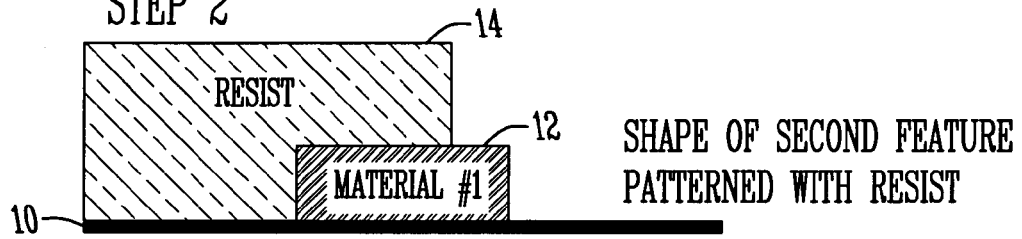
Figure 2:
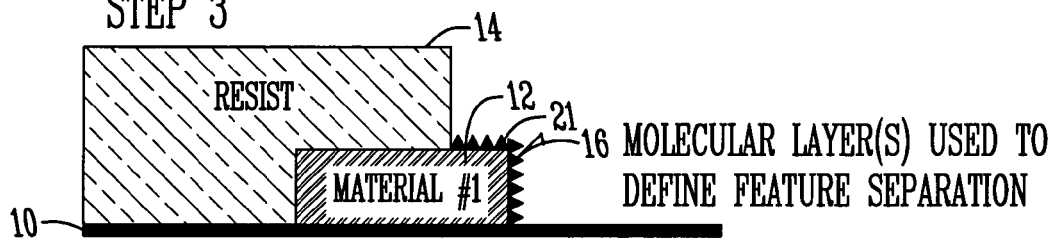
Figure 2:
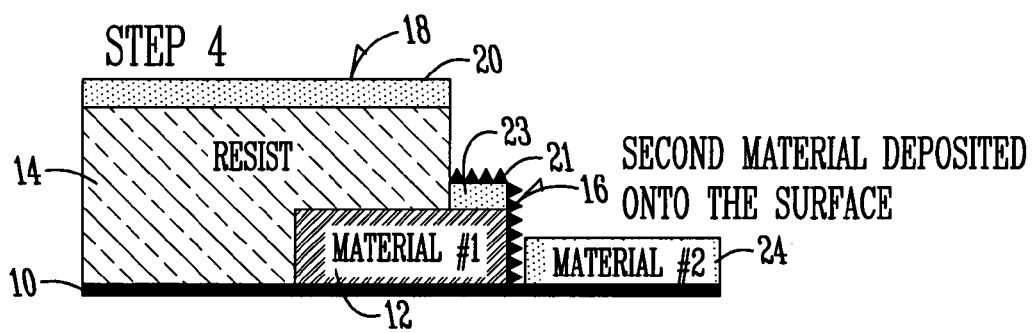
Figure 2:
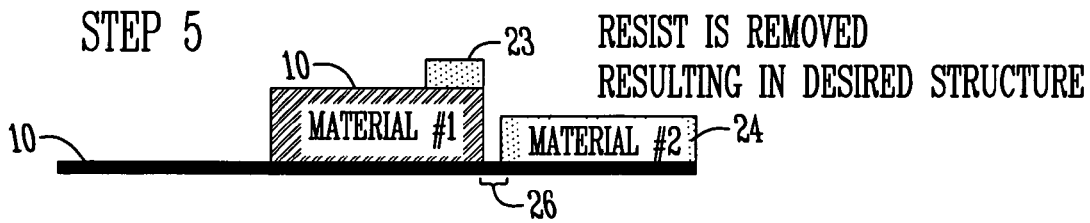

FIG. 2 illustrates one embodiment of the methodology of the present invention using a selective adsorption process. In FIG. 2, a substrate 10 is shown. A first material 12 is formed on the surface of the substrate 10 to define a first feature. The first material 12 can be formed through any conventional or otherwise known lithographic technique. In the next step, a resist 14 is applied to a portion of the first material 12. Next, one or more molecular layers 16 are applied to the first material 12. The one or more molecular layers 16 are used to define feature separation between the first feature and subsequently formed features. There is a region 21 of the one or more molecular layers 16 shown directly above a portion of the first material 12. Next, a second material 24 is deposited, including on the resist 14 and the first material 12. The molecular layers 16 also act as a resist. Preferably, the second material 24 and the molecular layers 16 are selected such that the second material will penetrate the molecular layers 16 as shown, leaving a region 23 of the second material deposited on the first material 12. The resist 14 and molecular layers 16 are then removed. The second material 24 is separated from the first material 12 by a spacing defined by the thickness of the molecular layers 16 which can be used to create a nanoscale gap. Note that due to the selective adsorption, nanoscale features of various sizes can be realized, including both the size of features themselves such as region 23 or a gap 24.

According to a preferred embodiment of the present invention, the second material and the molecular resist are selected so that the second material will penetrate the molecular resist and be deposited on the initial material below. FIG. 2 illustrates the steps in this procedure.

Figure 3:
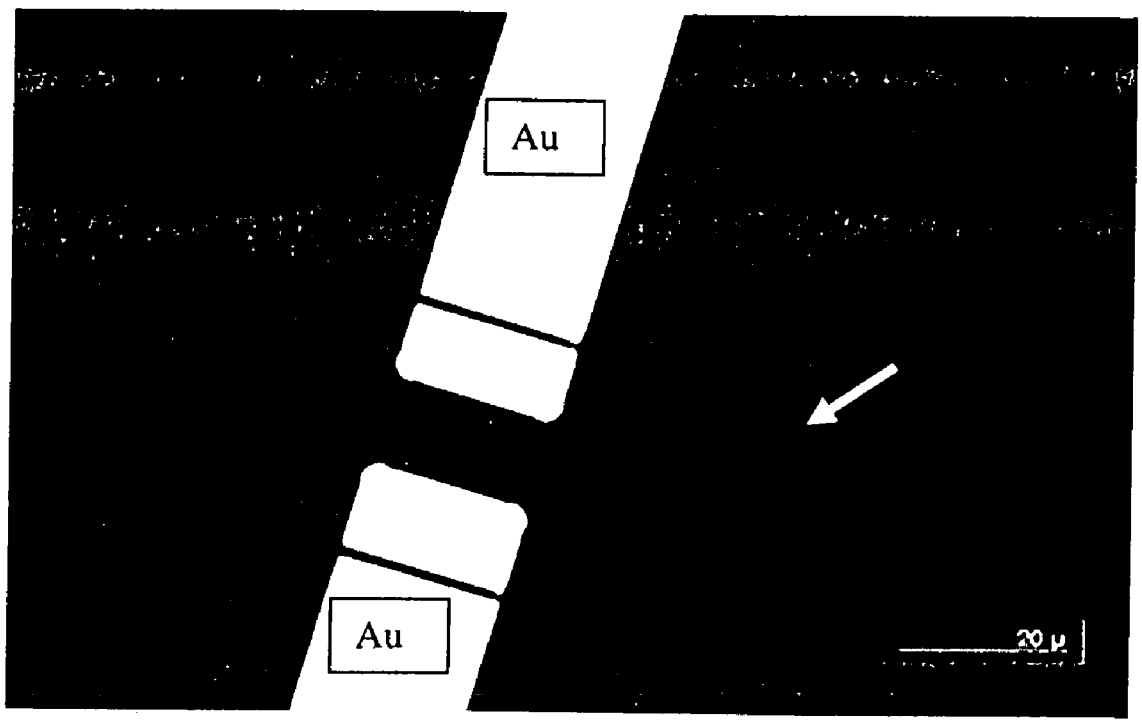
FIG. 3 is an optical microscope image of two gold electrodes that have been defined on a surface using a photolithographic lift-off process. The white arrow is pointing to the corner of another feature that is defined with photoresist.

FIG. 3 shows an optical micrograph of an initial structure with two metallic features. The metallic features have been modified with a molecular resist and a second photolithographic layer has been performed on the surface. The metallic, in this case gold electrodes are labeled and an arrow marks the corner of a line that has been defined using photolithography. This process used a single layer of molecules, a 20 carbon chain of alkanethiol.

Figure 4:
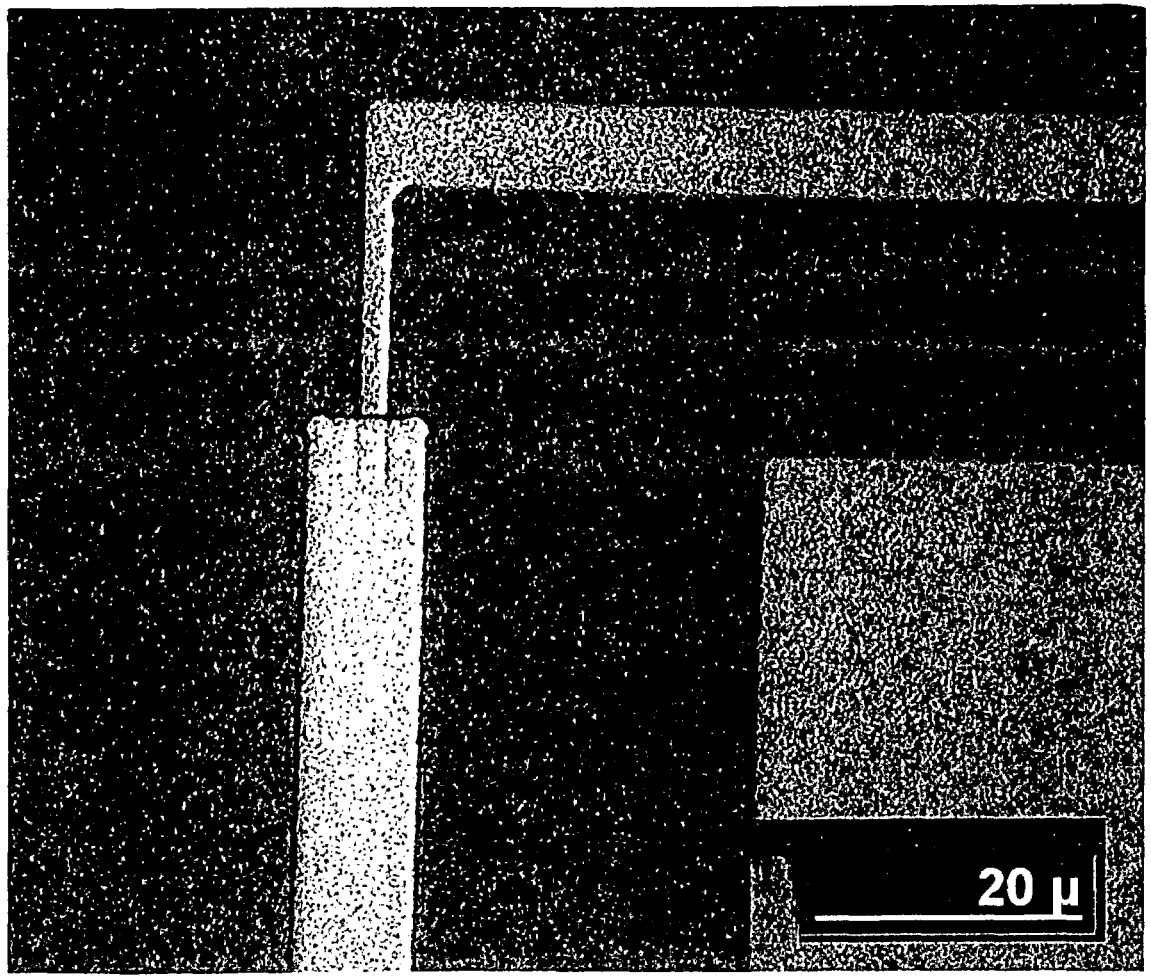
FIG. 4 is an optical image of two gold electrodes that have been fabricated using one embodiment of the process of the present invention.

FIG. 4 shows an optical micrograph of an electrode device made using the above outline molecular lithographic process.

Figure 5:
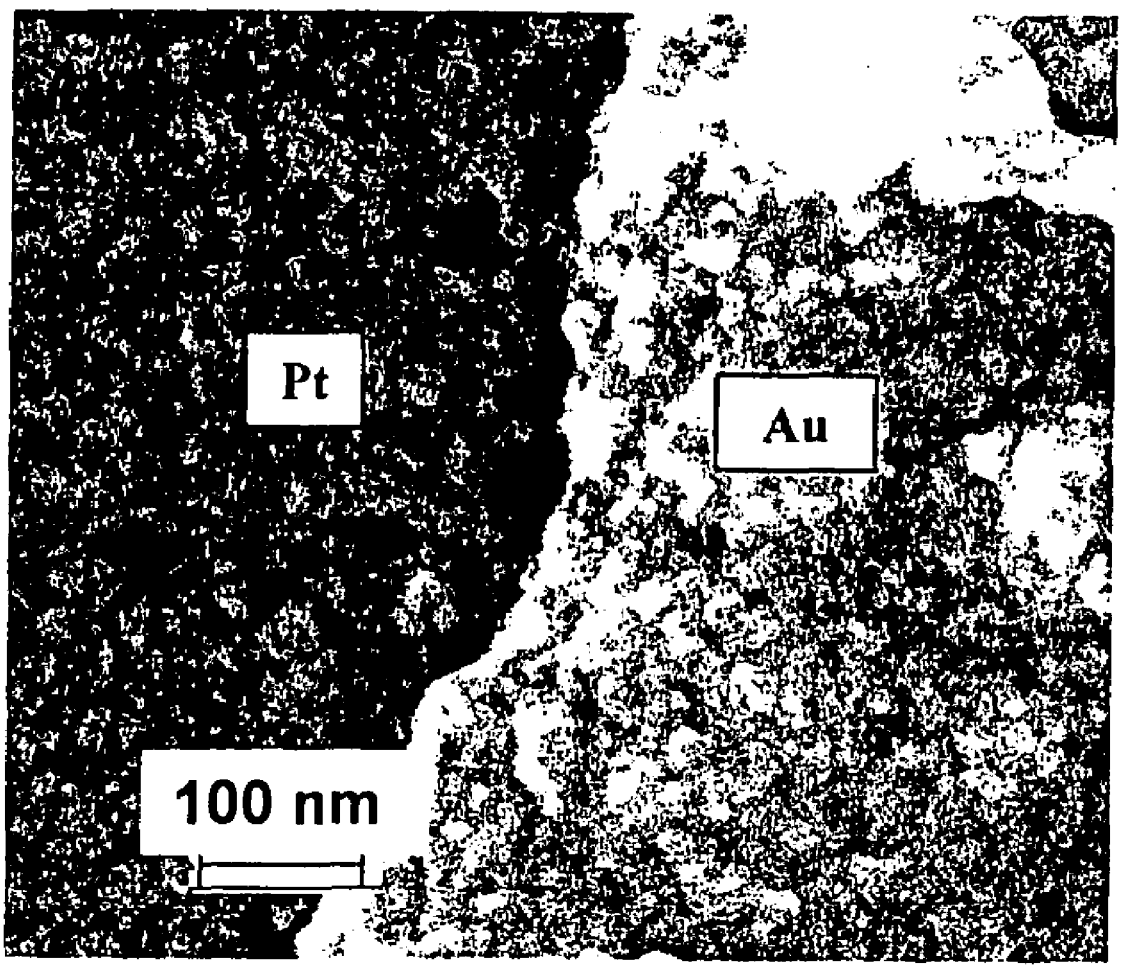
FIG. 5 is a scanning electron microscope image showing the interface between the two materials deposited according to embodiment of the molecular lithography process of the present invention. At this scale the separation designed to be 2.5 nm was not observed.

The electrode device can be used in numerous applications including nanogap sensors which are discussed in further detail below. This structure was fabricated with a defined spacing of 2.5 nanometers. Of course through by altering the thickness of the molecular resist, this spacing can be set at a desired thickness, whether 10 nm, 5 nm, 2 nm, or some other desired spacing. Unfortunately, due to the geometry of the structure and the extremely small size of the feature, the scanning electron microscope was not capable of resolving the separation shown in FIG. 5.

Figure 6:
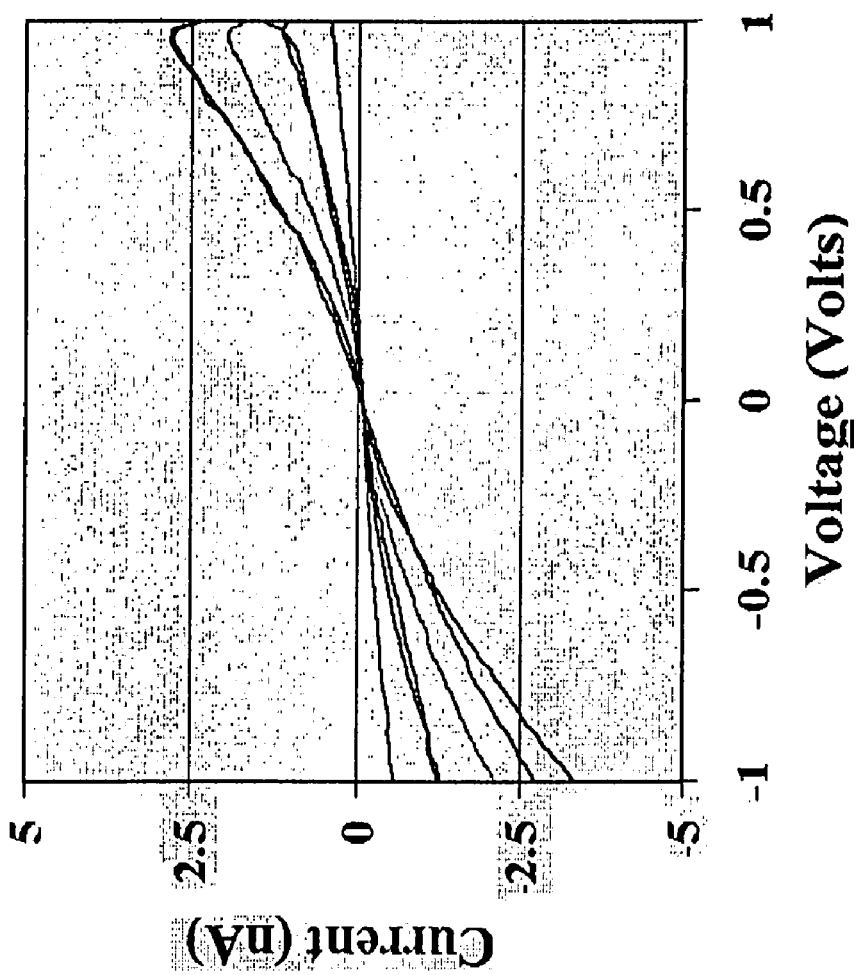
FIG. 6 is a graph showing a series of current-voltage characteristics for a number of devices that were fabricated to have a 2.5 nm separation. Very little current flows in this device.
Figure 8:
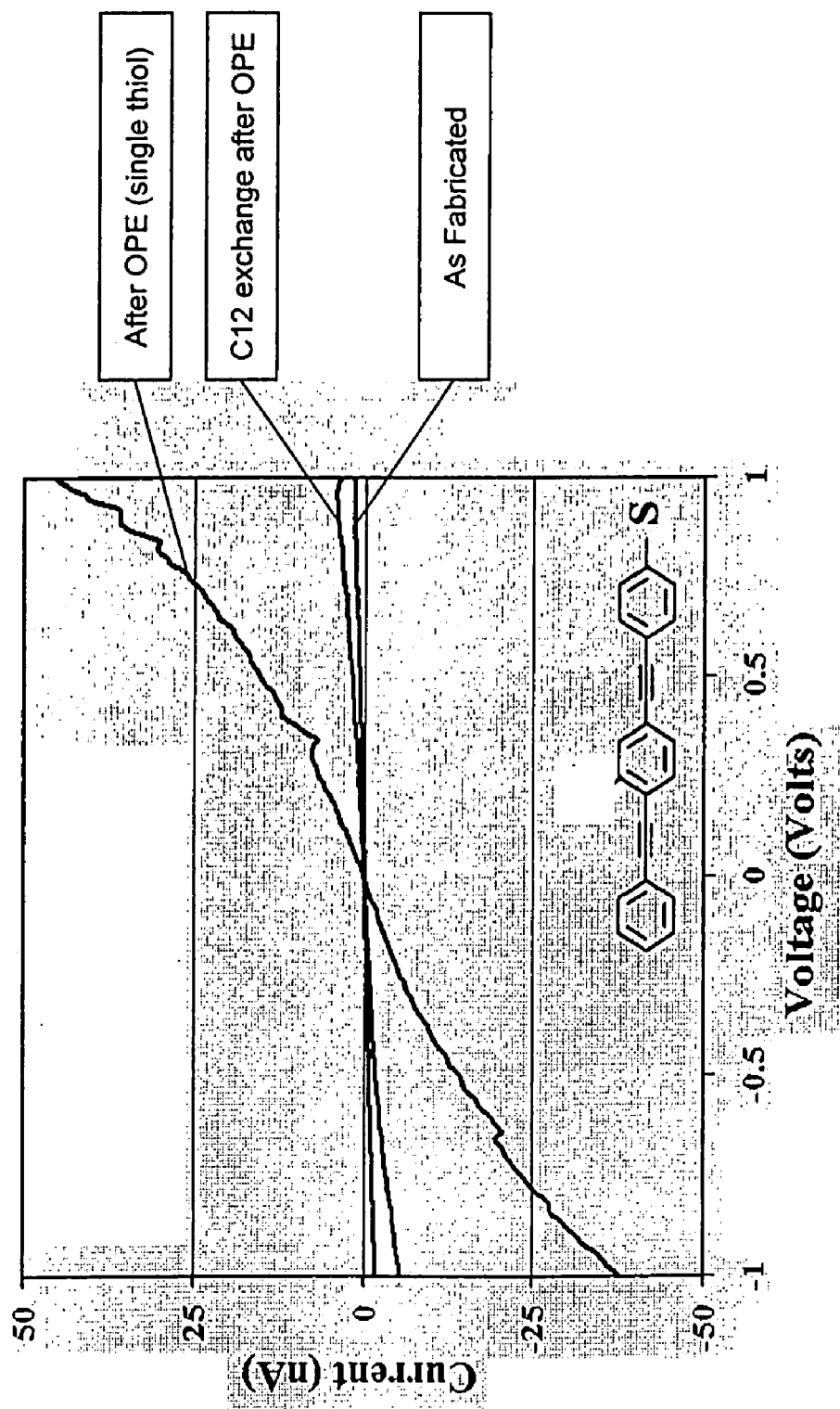
FIG. 8 is a graph showing how the current-voltage characteristics of a device are modified by adding or removing molecules from the junctions.

AFM data was also collected on the samples. The sample and tip geometries made imaging of the separation between the metallic features impossible, but the gold films maintain there quality to the limits the AFM was able to image (not shown). However, electronic data was collected on the structures. These data are consistent with a very small separation between the metallic electrodes. FIG. 6 shows an example of this data. In this case, the current-voltage characteristics of the 2.5 nm design separation device were probed. The device showed very little current flow from 1 volt to −1 volt in the as fabricated configuration. By submerging the device into a long organic molecule the metallic electrodes were bridged and the current increased as shown in FIG. 8.

Figure 7:
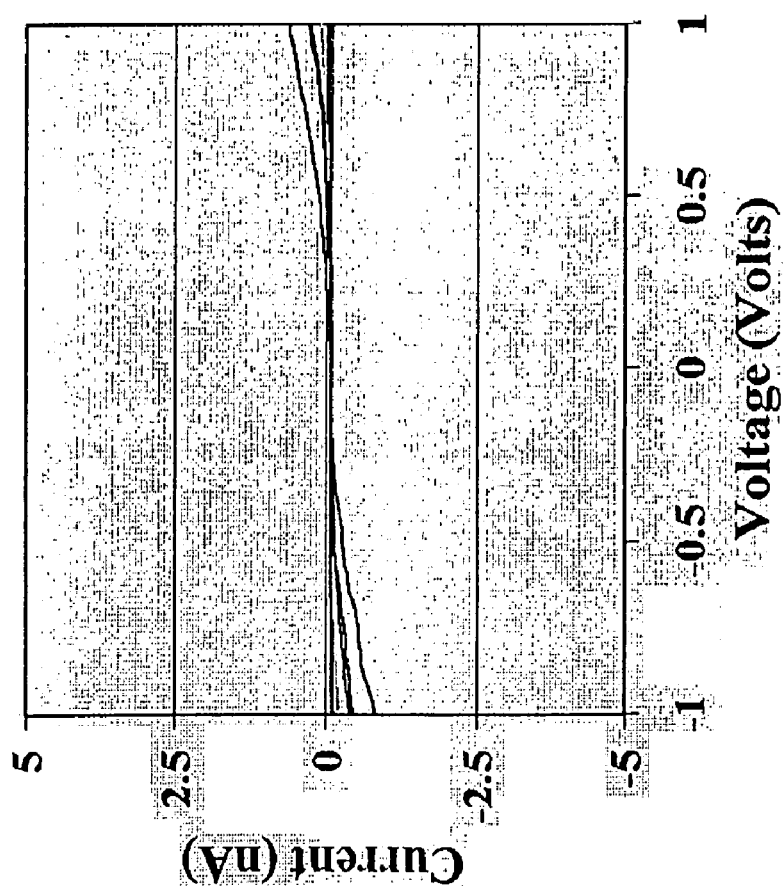
FIG. 7 is a graph showing a series of current-voltage characteristics for a number of devices that were fabricated to have a 3.6 nm separation. Very little current flows in these devices.

This same type of experiment was carried out for a multilayer film. This film was grown on Au features. It consisted of a mercaptohexadecanoic acid layer and then a layer of copper ions and then a dodecane thiol layer. This multilayer film produced a resist that was ~3.6 nm thick. After fabrication of the device the current-voltage characteristics were probed. FIG. 7 shows the as fabricated characteristics for the device from 1 volt to −1 volt.

Therefore, it should be clear that the present invention provides a manufacturable method to produce feature sizes of only a few nanometers using single or multilayered molecular films as selective resists. The present invention contemplates numerous variations in the features being produced, the specific size of the features, the type of resist, the number of layers in the resist, and other variations.

It should be appreciated that the structures formed from the present invention have numerous applications in nanofabricated systems. For example, the present invention further contemplates that particular molecules can be added or removed from the junctions in a nanofabricated system. The addition or removal of molecules can be manipulated appropriately to facilitate changes in the properties of the devices created through the selective adsorption molecular lithography of the present invention. These changes in the properties of the device can include, but are not limited to, an increase in conductance, and a decrease in conductance. The present invention further contemplates that the by monitoring the junction, in particular, the electronic properties of the junction, one determine whether molecular species have been added or removed from the junction. Similarly, the addition or a removal of a protein from the junction can be monitored through monitoring of the electronic properties of the junction.

FIG. 8 shows a series of I-V curves collected for a single device over a series of experiments. The first curve in blue show the I-V characteristics of the device as fabricated. This device is composed of a two metallic lines with an extremely small separation created through the use of a selective adsorption molecular lithography. The device can be immersed in a solution contain a different type of molecule in this case we use a thiol containing oligiophenylethylene type molecule. Due to the high degree of Pi bonding this molecule is more conducting than a standard alkanethiol molecule. The present invention contemplates, however, that other types of molecules can be used dependent upon the particular result desired. The sample is removed from the solution and dried. Its electronic character is then recorded (maroon curve in FIG. 8). The I-V curve demonstrates an increase in the current passing through the nanofabricated junction. This increase in current is enabled because of the addition of the oligiophenylethylene type molecules to the junction. The sample can be immersed in a solution contain alkane thiol molecules. The alkane thiol molecules will replace the oligiophenylethylene type molecules in the junction and lead to a decrease in the conductivity of the junction as can be seen in FIG. 8 the pink curve. Thus, it should be apparent to one skilled in the art that the characteristics or properties of a device can be altered through adding or removing molecules to or from one or more of the junctions. One should also recognize that the present invention also allows the addition or removal of molecule to be monitored by monitoring the electronic properties of the device.

Figure 9:
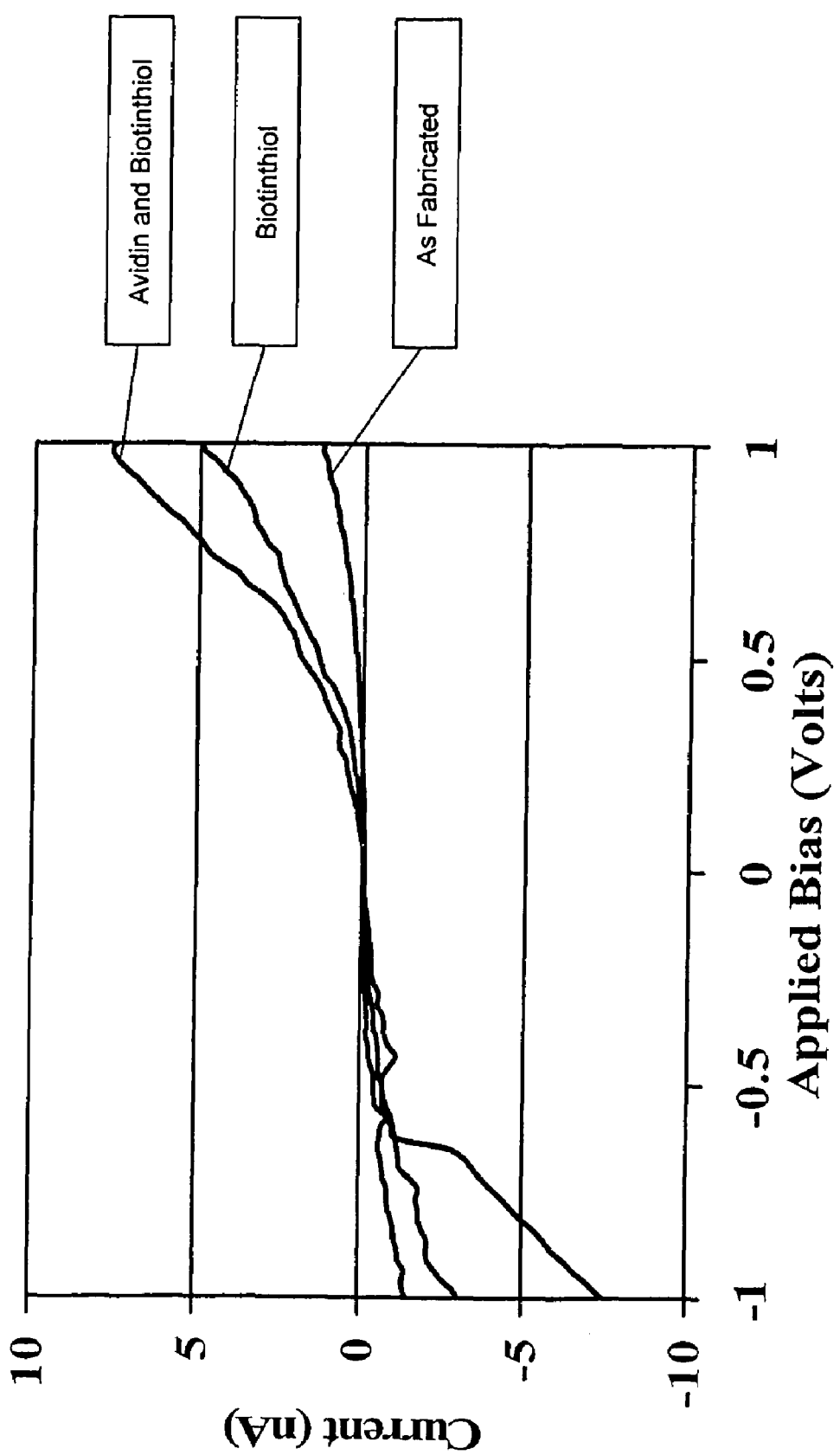
FIG. 9 is a graph showing how the current-voltage characteristics of a device are modified by adding protein at a junction.

The present invention also provides for modifying the current-voltage characteristics of device by through the addition of protein to a junction. FIG. 9 show a series of I-V curves collected for the same junction under a series of different conditions. The blue curve shows the electronic character of the nanofabricated junction as fabricate. The junction is then modified by immersion in a solution containing molecules with a thiol and a biotin type functionality. The thiol of the molecule binds to the gold electrodes with the biotin functionality normal to the surface. The pink curve shows an increase in the conductivity of the junction for this modification. The device is then immersed in a solution containing the protein avidin. The avidin forms a strong and highly selective complex with biotin. The addition of the avidin to the molecular junction increase the conductivity of the system further as can be seen by the yellow curve in FIG. 9. The present invention contemplates that other types of proteins may be added or removed dependent upon the particular characteristics desired. Similarly, it should be clear to one skilled in the art having the benefit of this disclosure that the addition or removal of a protein can be monitored by monitoring the electronic properties of the device.

Figure 10:
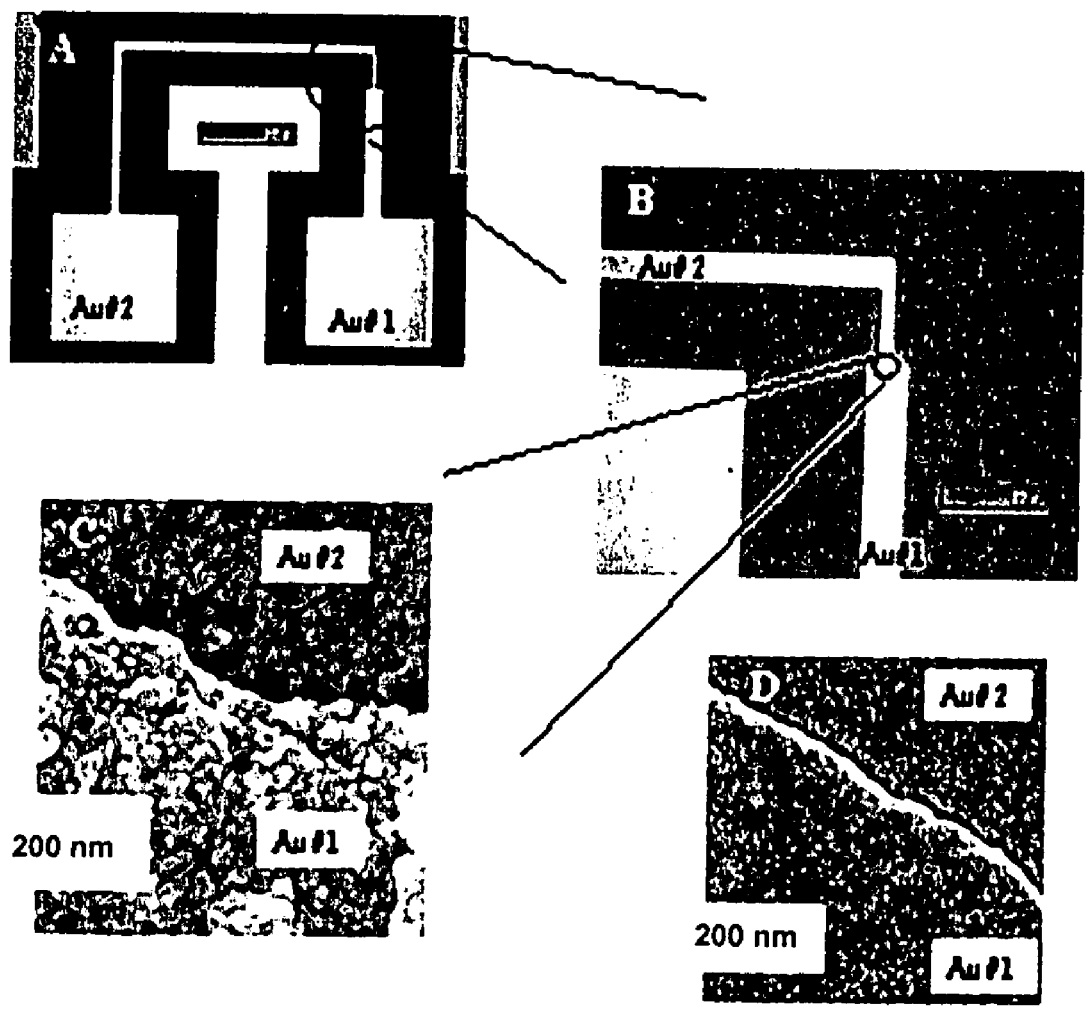
FIG. 10 is a series of images illustrating a nanogap sensor according to one embodiment of the present invention, including: A) An optical micrograph showing an electrode pair after fabrication; B) An optical micrograph and C) an electron micrograph showing the interface an individual electrode pair with a separation of 2 nm after fabrication and D) an electron micrograph of the interface of an electrode pair fabricated with a separation of 6 nm.

One application of the methodology of the present is in forming a nanogap sensor. FIG. 10A shows an optical micrograph of a nanogap sensor according to one embodiment of the present invention. The two large gold pads at the bottom of the image are used to make connection to the outside world. The black circle in the figure highlights the interface between the electrodes. The electrodes are labeled as Au#1 for the initial electrode and Au#2 for the second electrode. FIG. 10B shows an optical micrograph of the interface between the two electrodes. The black circle highlights the position of the gap between the electrodes. FIG. 10C shows a scanning electron micrograph of the interface between the electrodes in a nanogap sensor with designed separation of 2.6 nm. Too improve the image quality and enable quantification of the gap between the electrodes, a structure was fabricated with a 5.6 nm distance between the electrodes. Of course, the present invention provides for designing a size of gap based on the thickness of molecular resist used in the fabrication process. FIG. 10D shows an electron micrograph of the interface between the electrodes of this nanogap sensor.

After fabrication, the nanogap sensors are functionalized with single stranded oligonucleotides modified with thiols. The adsorption of the oligionucleotides and then the hybridization of the adsorbed oligionucleotides have been detected. This is achieved by analyzing the current-voltage characteristics of the electrode pairs initially, after adding thiol-modified single stranded oligionucleotides and after immersion in a solution of complementary oligionucleotides. With the addition of thiol-modified single stranded DNA the ability of the device to pass current increases significantly. After immersion in the solution containing the complimentary strand of oligionucleotides, the current-voltage characteristics increase again. Controls were performed to insure that the variation in the electronic properties of the electrode pairs resulted from the addition of oligionucleotides. This simple experiment demonstrated the ability to detect oligionucleotides and oligonucleotide hybridization with nanogap sensors. This techniques offer several advantages over conventional optical detection schemes including extremely high temporal resolution, multiplexing capabilities, integration with existing CMOS electronics and the possibility of single (or few) event monitoring.

Therefore methods for patterning a surface have been disclosed. These methods provide for numerous advantages, including monitoring the addition or removal of molecules or proteins from a junction of a nanofabricated structure have been disclosed. It should be clear that the present invention contemplates numerous variations in the particular materials deposited or resists used in the surface patterning process. Similarly, the present invention contemplates numerous variations in the molecules or proteins added, removed, or monitored. These and other variations are well within the spirit and scope of the invention.

What is claimed is:

1. A method of patterning a surface for use in a nanoscale device comprising:
   depositing a first material on the surface;
   applying a resist to the first material and to the surface;
   applying a molecular layer to the first material;
   applying a second material to the surface, such that the first material is separated from the second material by the molecular layer, wherein the second material and the molecular layer are selected such that the second material penetrates the molecular layer to deposit on the first material; and
   removing the molecular layer to result in a structure formed from the first material and the second material.

2. The method of claim 1 wherein the molecular layer is a single molecular layer.

3. The method of claim 1 wherein the structure is a nanogap sensor structure.

4. The method of claim 3 further comprising functionalizing the nanogap sensor structure with oligonucleotides.

5. The method of claim 1 wherein the step of depositing the first material is performed by a deposition technique selected from the set comprising photolithography, electron beam lithography, molecular lithography, imprint lithography.

6. The method of claim 1 wherein the molecular layer is formed by covalently bonding additional species to form a thicker molecular resist.

* * * * *